United States Patent [19]

Shinohara et al.

[11] Patent Number: 5,896,050

[45] Date of Patent: Apr. 20, 1999

[54] SIGNAL GENERATING CIRCUIT AND PEAK DETECTION CIRCUIT

[75] Inventors: Mahito Shinohara, Tokyo; Isamu Ueno, Hadano, both of Japan

[73] Assignee: Canon Kabushiki Kaisha, Tokyo, Japan

[21] Appl. No.: 08/785,222

[22] Filed: Jan. 17, 1997

[30] Foreign Application Priority Data

Jan. 19, 1996 [JP] Japan .................. 8-007325

[51] Int. Cl.$^6$ .................................................. G01R 19/00
[52] U.S. Cl. .................................................. 327/58; 327/94
[58] Field of Search .................................. 327/58–62, 91, 327/94–96, 77, 384, 385, 386, 407

[56] References Cited

U.S. PATENT DOCUMENTS

| | | | |
|---|---|---|---|
| 4,617,473 | 10/1986 | Bingham | 327/546 |
| 4,806,789 | 2/1989 | Sakihama et al. | 327/543 |
| 5,272,393 | 12/1993 | Horiguchi et al. | 327/535 |
| 5,302,863 | 4/1994 | Walley et al. | 327/60 |
| 5,315,185 | 5/1994 | Usimaru | 327/384 |
| 5,381,052 | 1/1995 | Kolte | 327/58 |

*Primary Examiner*—Toan Tran
*Attorney, Agent, or Firm*—Fitzpatrick, Cella, Harper & Scinto

[57] ABSTRACT

In order to eliminate an erroneous peak detection caused by turn-on characteristics of switches, a signal generating circuit comprises a first switching device for controlling the output of a first signal, a second switching device for controlling the output of a second signal, and a comparator to which the first and second signals are applied, and either one of the first and second switching device is enabled by the output of the comparator to produce a signal having a higher or lower level than that of the other signal.

11 Claims, 3 Drawing Sheets

5,896,050

SIGNAL GENERATING CIRCUIT AND PEAK DETECTION CIRCUIT

BACKGROUND OF THE INVENTION

1. Field of the Invention

The present invention relates to a signal generating circuit and a peak detection circuit, and more particularly to a signal generating circuit for detecting and comparing two different signals to produce either one of these signals, or alternatively a peak detection circuit for detecting a maximum or minimum signal output from a plurality of signal sources.

2. Brief Description of the Related Art

For example, the peak detection circuit for detecting a maximum or minimum signal output from a plurality of signal sources is used for adjustment of sensitivity of a video camera. FIG. 4 shows the construction of an example of a conventional peak detection circuit.

In FIG. 4, symbols $S_1$ to $S_4$ are signal sources, and the output signals from the sources are applied to each base of bipolar transistors $Tr_1$ to $Tr_4$. The emitters of transistors $Tr_1$ to $Tr_4$ are commonly connected to each other and also connected to a resistor R and an output buffer amplifier B.

In such a peak detection circuit, when a signal having the highest peak level is generated from any one signal source, the bipolar transistor associated therewith is turned on, a current flows through the resistor R to increase the level of the common line, and the transistors except the one to which the maximum peak level signal is applied is turned off. As a result, the output having the maximum peak value is detected by the buffer amplifier B.

However, when two or more transistors in the above described circuit are simultaneously turned on (for example, when signals having levels close enough are produced, two or more transistors are turned on), a further increased current flows through the resistor R to further raise the level of the common line, thereby the different peak value is detected even though the signals the same peak level value.

SUMMARY OF THE INVENTION

In view of the above disadvantage, the signal generating circuit according to one aspect of the present invention comprises a first switching means for controlling the output of a first signal, a second switching means for controlling the output of a second signal, and a comparator to which the first and second signals are applied, and either one of the first and second switching means is enabled by the output of the comparator to produce a signal having a higher or lower level than that of the other signal.

A peak detection circuit according to another aspect of the present invention includes a plurality of stages of peak detection units (which comprises the above-mentioned signal producing circuit) connected in series to each other, and the peak detection unit comprises first switching means for controlling the output of a first signal, second switching means for controlling the output of a second signal, and a comparator to which the first and second signals are applied; and either one of the first and second switching means is enabled by the output of the comparator to produce a signal having a higher level than that of the other signal, wherein the first signal in each unit is generated from a signal source provided separately for each unit, and each of the second signals is an output signal produced from the preceding stage of a peak detection unit.

Also, in another peak detection circuit according to a further aspect of the present invention, a plurality of signal sources are connected to a common output line through the first switching means; the common output line is connected to a signal hold means through the second switching means; the signal hold means is connected to another input terminal of the comparator; turning-on of the second switching means is controlled by the output of the comparator, and turning-on of the first switching means is sequentially controlled by signal transferring means.

The peak detection circuit according to the invention is to detect not only the maximum value but also the minimum value of the signals.

DETAILED DESCRIPTION OF THE PREFERRED EMBODIMENTS

The embodiments of the present invention is described with reference to the accompanying drawings.

Embodiment 1

Figure 1:
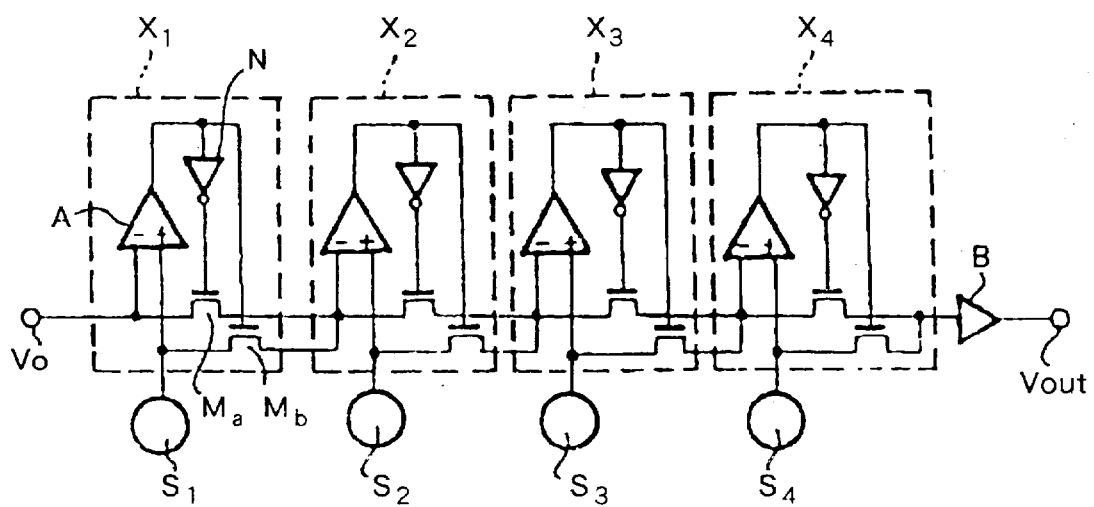
FIG. 1 is a circuit diagram of a peak detection circuit according to the first embodiment of the invention.

FIG. 1 shows the circuit construction of a peak detection circuit according to Embodiment 1 of the present invention. As shown therein, symbols $X_1$ to $X_4$ denote peak generating units, $S_1$ to $S_4$ denote signal sources, and B denotes an output buffer amplifier. For the purpose of simplicity, only four peak generating units and signal sources, respectively, are illustrated. Each of the peak generating units $X_1$ to $X_4$ corresponds to a signal generating circuit of the invention.

Signals are produced from signal sources $S_1$ to $S_4$ and applied to peak generating units $X_1$ to $X_4$. Each peak generating unit produces the one output signal having the higher level, which is applied to the unit of the next stage, from among (i) the signal produced from the unit of the preceding stage and (ii) the signal produced from the associated signal source. For example, in the case of peak generating unit $X_2$, a signal is produced and applied to the next unit $X_3$, wherein such a signal is either that produced from the unit $X_1$ or that generated by the signal source $S_2$, but has the higher level than that of the other. Accordingly, a signal having the highest level among those produced from the signal sources $S_1$ to $S_4$ is produced from the unit $X_4$ in the last stage. In addition, a comparative voltage $V_o$ is applied to the unit $X_1$ of the first stage. This comparative voltage $V_o$ may be lower than the peak values of each of the signal voltages produced from signal sources $S_1$ to $S_4$, but more preferably is set at a voltage lower than any of the signal voltages produced from signal sources $S_1$ to $S_4$.

Hereinafter described are the construction and operation of the peak generation units, typically on the unit $X_1$ as an example.

As shown in FIG. 1, the peak generating unit $X_1$ comprises a comparator A, an inverter N, and a pair of n-channel MOS transistors $M_a$ and $M_b$, wherein an output voltage $V_1$ from the signal source $S_1$ is applied to the non-inverting input terminal (+) and the comparative voltage $V_o$ is applied to the inverting terminal (−) of the comparator A. When $V_1$ is higher than $V_o$, a signal having the high level "H" is produced to turn the transistor $M_b$ to its ON state, and the signal voltage $V_1$ is applied to the subsequent unit $X_2$. In other words, a signal voltage having the higher level is selected from the voltages $V_1$ and $V_o$ and applied to the next peak generating unit $X_2$. In this case, even though both voltages are different from each other by only a small amount, the level of comparator A is turned either on or off, thereby a voltage having the higher level is definitely produced.

In each unit after the unit $X_2$, an output produced from the preceding unit is applied to the inverting terminal (−).

As described above, an output having the higher level between the preceding unit and the associated signal source is produced in each stage of the unit. As a result, the highest signal among those generated by the sources $S_1$ to $S_4$ is always produced from the output buffer amplifier B.

As described above, although the peak detection circuit shown in FIG. 1 is to determine the maximum value of signals, the invention is also applied for the purpose of determining the minimum value of signals. For example, the modifications therefore are such that an inverter N is connected to the MOS transistor $M_b$, and the output of the comparator A is connected to the MOS transistor $M_a$ or n-channel MOS transistors $M_a$ and $M_b$ are replaced by p-channel MOS transistors.

The construction of the signal sources is described hereinafter.

Figure 2A:
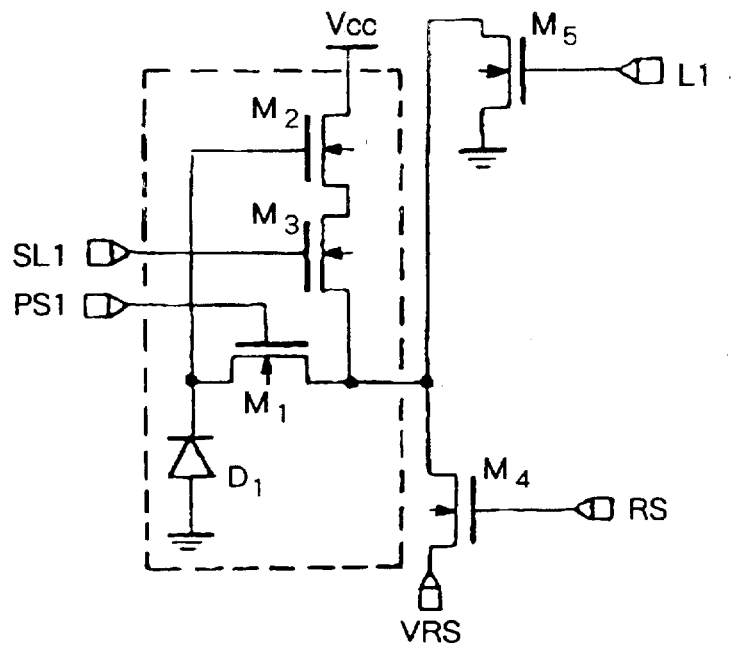
FIG. 2A is a circuit diagram of a signal source included in the peak detection circuit of FIG. 1.
Figure 2B:
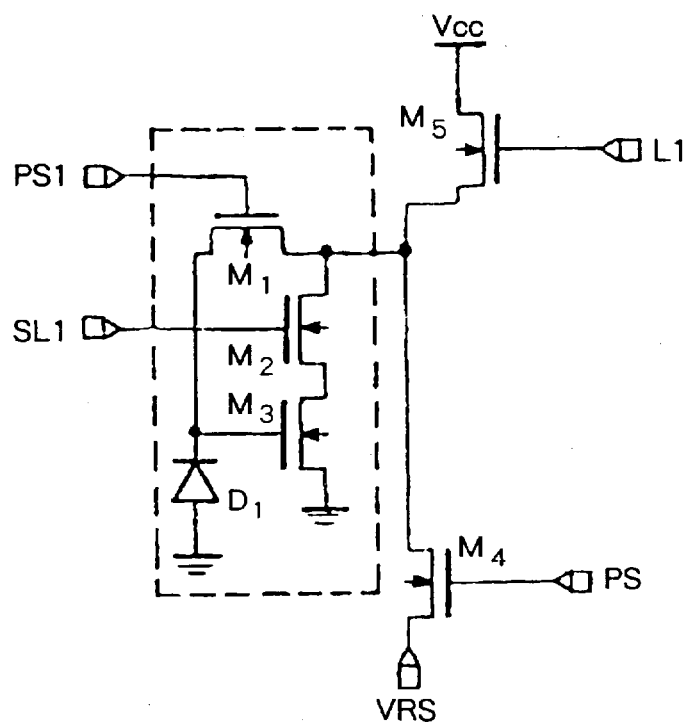
FIG. 2B is a circuit diagram of another form of a signal source.

FIGS. 2A and 2B each shows the circuit construction of a MOS sensor as an example of the signal source. In FIGS. 2A and 2B, each sensor cell (shown as enclosed by dotted line) includes a photodiode and MOS transistors $M_1$ to $M_3$. Here, $SL_1$, $PS_1$, $L_1$ and RS denote control signal input terminals, while VRS denotes a signal output terminal.

In the MOS sensor shown in FIG. 2A, first the MOS transistors $M_1$ and $M_4$ are turned to their ON state and the charges still remaining on the photodiode D, and the gate of MOS $M_2$ are reset (Reset operation); next, the transistor $M_1$ is turned off, a charge photoelectrically converted by photodiode $D_1$ is accumulated on the gate of $M_2$ (Accumulating operation); then the MOS transistors $M_3$ and $M_5$ are turned to their ON state, and a current corresponding to the accumulated charge on the gate of $M_2$ flows and the signal is read out (Read-out operation). During the period of such read-out operation of the MOS sensor, the signal is produced and applied to the peak detection circuit shown in FIG. 1.

In another MOS sensor shown in FIG. 2B, initially the MOS transistors $M_1$ and $M_4$ are turned to their ON States and the charges still remaining on a photodiode $D_1$ and the gate of a MOS $M_3$ are reset (Reset operation); next, the transistor $M_1$ is turned off, a charge photoelectrically converted by photodiode $D_1$ is accumulated on the gate of $M_3$ (Accumulating operation); then the MOS transistors $M_2$ and $M_5$ are turned to their ON States, and a current corresponding to the accumulated charge on the gate of $M_3$ flows and the signal is read out (Read-out operation). During the period of such read-out operation of the MOS sensor, the signal is produced and applied to the peak detection circuit shown in FIG. 1. In the case of the MOS sensor in FIG. 2B, the signal having the inverted polarity is produced, thereby to detect the lowest value of the signal.

In addition, in the MOS sensor in either of FIGS. 2A and 2B, the signal may be also detected during the period of the accumulating operation to detect the peak value.

Although, in the above example, two types of sensors are shown, other types of sensors (e.g. COD, AMI, BASIS, etc.) are easily adapted to this invention.

Embodiment 2

Figure 3:
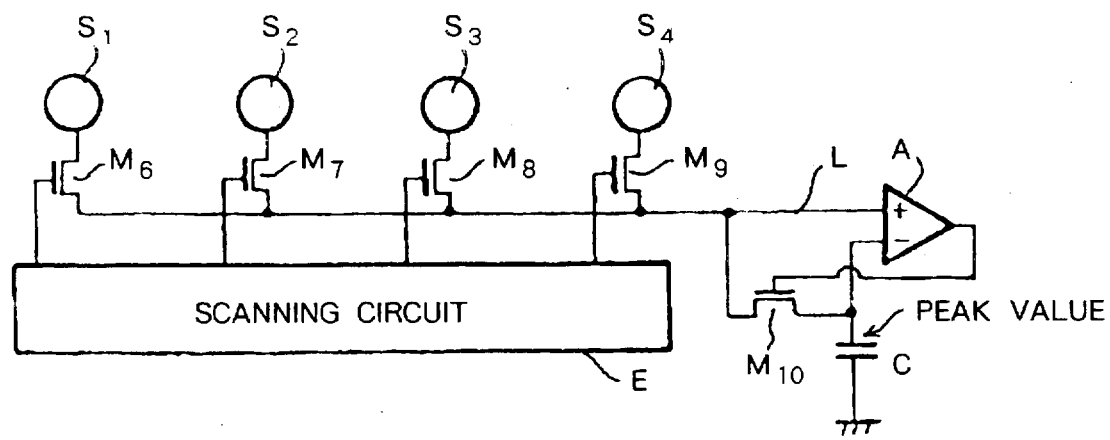
FIG. 3 is a circuit diagram of a peak detection circuit according to the second embodiment of the invention.
Figure 4:
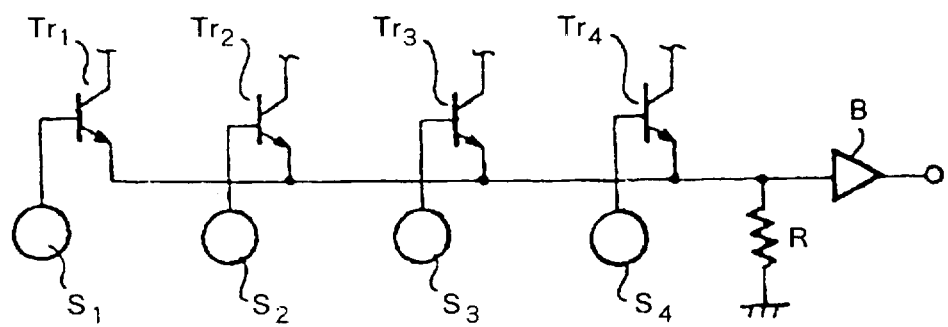
FIG. 4 is a circuit diagram of a peak detection circuit according to the prior art.

FIG. 3 shows the circuit construction of a peak detection circuit according to the Embodiment 2 of the present invention. As shown therein, symbols $S_1$ to $S_4$ are signal sources, which sources $S_1$ to $S_4$ are connected to a common output line L through MOS transistors $M_6$ to $M_9$ respectively. These transistors $M_6$ to $M_9$ are sequentially selected by means of a scanning circuit E. The common output line L is connected to the non-inverting input terminal (+) of the comparator A and is also connected to the inverting terminal and hold means C through a MOS transistor $M_{10}$. The output of the comparator A is coupled to the gate of the transistor $M_{10}$.

The operation of the peak detection circuit is described below.

In operation, when MOS transistors $M_6$ to $M_9$ are successively turned on by way of the scanning circuit E, the signals produced from the signal sources $S_1$ to $S_4$ are sequentially applied to the common line L via transistors $M_6$ to $M_9$, respectively. When a signal from the signal source $S_1$ is applied to the common line L, and the level thereof is higher than the potential of the accumulator means C, then a signal having a high level "H" is produced from the comparator A to turn the transistor $M_{10}$ on, and the signal from the source $S_1$ is stored in the hold means C. When the level of the signal from the source $S_1$ is lower than that of the accumulator means C, a signal having a low level "L" is produced from the comparator A to maintain the transistor $M_{10}$ in its OFF state, and the potential of the hold means C is maintained. As a result, the signal whose level is higher than the other is stored in the hold means C.

In addition, the level of the hold means C is reset before the signal from the source $S_1$ is produced onto the common line L. The reset level may be basically lower than that of the peak value of signals produced from the sources $S_1$ to $S_4$, but preferably lower than that of these signals.

As the signals are sequentially produced, each signal is treated in the same manner as the signal from the source $S_1$, and the signal having the higher level is stored at each stage. As a result, a signal having the highest level among those produced from the sources $S_1$ to $S_4$ is finally stored in the accumulator means C. In such a manner, the peak value of the signal is produced and the maximum value can be detected.

Also, when the output of the comparator is applied to the MOS transistor through such as an inverter, the minimum value of the signals can be detected.

As described above, the maximum or minimum value of the output produced from a plurality of signal sources can be detected with high speed and high accuracy according to the invention.

We claim:

1. A peak detection circuit including a plurality of peak detection units connected in series to each other, each said peak detection unit comprising:

first switching means for selectively outputting a first signal;

second switching means for selectively outputting a second signal; and a comparator to which the first and second signals are applied;

either one of said first and second switching means being enabled by an output of said comparator to transfer the one of said first and second signals which has a higher level than the other signal to an output of the unit;

wherein said first signal in said each unit is inputted from a signal source provided separately for each unit, and wherein each of said second signals is inputted from a preceding peak detection unit.

2. A peak detection circuit comprising:

a common output line;

a plurality of signal sources;

a plurality of first switching means for respectively coupling to said plurality of signal sources to said common output line;

a signal hold means;

second switching means for coupling said common output line to said signal hold means;

a comparator coupled to said common output line and said signal hold means;

signal transferring means;

said second switching means being controlled by an output of said comparator; and said first switching means being sequentially controlled by said signal transferring means.

3. A circuit according to claim 1, wherein the signal source comprises a MOS sensor.

4. A circuit according to claim 3, wherein said MOS sensor includes amplifying means for amplifying a photo-electrically transformed signal.

5. A circuit according to claim 2, wherein said common output line is directly connected to said second switching means.

6. A circuit according to claim 2, wherein said common output line is directly connected to said comparator.

7. A circuit according to claim 2, wherein each said signal source includes a MOS sensor.

8. A circuit according to claim 7, wherein said MOS sensor includes amplifying means for amplifying a photo-electrically transformed signal.

9. A peak detection circuit including a plurality of peak detection units connected in series to each other, each said peak detection unit comprising:

a first switching means for selectively outputting a first signal;

a second switching means for selectively outputting a second signal;

a comparator to which the first and second signals are applied;

either one of said first and second switching means being enabled by an output of said comparator to transfer the one of said first and second signals which has a lower level than the other signal to an output of the unit; and wherein said first signal in said each unit is inputted from a signal source provided separately for each unit, and wherein each of said signal signals is inputted from a preceding peak detection unit.

10. A circuit according to claim 9, wherein said signal source includes a MOS sensor.

11. A circuit according to claim 10, wherein said MOS sensor includes amplifying means for amplifying a photo-electrically transformed signal.

* * * * *

UNITED STATES PATENT AND TRADEMARK OFFICE
CERTIFICATE OF CORRECTION

PATENT NO. : 5,896,050
DATED : April 20, 1999
INVENTOR(S) : MAHITO SHINOHARA, ET AL.

It is certified that error appears in the above-identified patent and that said Letters Patent is hereby corrected as shown below:

Title page, item
[75] Inventors:

"Tokyo;" should read --Machida;--.

Column 1

Line 38, "signals" should read --signals have--.

Column 2

Line 29, "is" should read --are--.

Column 4

Line 49, "such as" should be deleted.

Column 5

Line 11, "to" (first occurrence) should be deleted.

Signed and Sealed this

Thirtieth Day of November, 1999

Attest:

Q. TODD DICKINSON

Attesting Officer

Acting Commissioner of Patents and Trademarks